US012601046B2

(12) United States Patent
Kurokawa et al.

(10) Patent No.: US 12,601,046 B2
(45) Date of Patent: Apr. 14, 2026

(54) HEATING DEVICE AND METHOD OF MANUFACTURING MAGNETIC RECORDING MEDIUM

(71) Applicant: Resonac Corporation, Tokyo (JP)

(72) Inventors: Gohei Kurokawa, Chiba (JP); Haruhisa Ohashi, Chiba (JP); Takahiro Inoue, Tokyo (JP)

(73) Assignee: RESONAC HARD DISK CORPORATION, Chiba (JP)

( * ) Notice: Subject to any disclaimer, the term of this patent is extended or adjusted under 35 U.S.C. 154(b) by 0 days.

(21) Appl. No.: 18/889,857

(22) Filed: Sep. 19, 2024

(65) Prior Publication Data

US 2025/0101574 A1 Mar. 27, 2025

(30) Foreign Application Priority Data

Sep. 27, 2023 (JP) ................................. 2023-166285

(51) Int. Cl.
| | |
|---|---|
| *C23C 14/58* | (2006.01) |
| *C23C 16/46* | (2006.01) |
| *G11B 5/82* | (2006.01) |
| *G11B 5/851* | (2006.01) |
| *H10P 72/00* | (2026.01) |

(52) U.S. Cl.
CPC .......... *C23C 14/5806* (2013.01); *C23C 16/46* (2013.01); *G11B 5/82* (2013.01); *G11B 5/851* (2013.01); *H10P 72/0436* (2026.01)

(58) Field of Classification Search
CPC ....... C23C 14/5806; C23C 16/46; G11B 5/82; G11B 5/851; H01L 21/67115
See application file for complete search history.

(56) References Cited

U.S. PATENT DOCUMENTS

| | | | | |
|---|---|---|---|---|
| 12,418,161 | B2* | 9/2025 | Kondo ................... | G01B 11/24 |
| 2016/0195333 | A1* | 7/2016 | Kawarazaki ...... | H01L 21/28202 |
| | | | | 438/761 |
| 2020/0251362 | A1* | 8/2020 | Luckner ........... | H01L 21/67248 |

FOREIGN PATENT DOCUMENTS

| | | | | |
|---|---|---|---|---|
| JP | 2002-129326 | 5/2002 | | |
| JP | 2022-172776 | 11/2022 | | |
| WO | WO-2025047937 A1 * | 3/2025 | ............... | G11B 5/84 |

OTHER PUBLICATIONS

WO-2025047937-A1 translation (Year: 2025).*

* cited by examiner

*Primary Examiner* — Michael G Hoang
*Assistant Examiner* — Kurt J Wolford
(74) *Attorney, Agent, or Firm* — IPUSA, PLLC

(57) ABSTRACT

To provide a heating device capable of heating a surface of a workpiece having a disk shape with a hole in the center at high productivity and uniformity, a heating device for heating a workpiece by irradiating workpiece with light includes an irradiating part facing at least one of a pair of main surfaces of workpiece to irradiate workpiece with light. Irradiating part includes plurality of light emitting elements on surface thereof facing the at least one main surface. Surface of the irradiating part facing the workpiece includes first region including a position corresponding to the center of the workpiece, second region surrounding first region from outer side, and third region surrounding second region from outer side and including a position corresponding to the outer periphery of the workpiece. Amount of light emission per unit area in third region is greater than that in each of first and second regions.

13 Claims, 8 Drawing Sheets

HEATING DEVICE AND METHOD OF MANUFACTURING MAGNETIC RECORDING MEDIUM

CROSS-REFERENCE TO RELATED APPLICATION

The present application claims priority under 35 U.S.C. § 119 to Japanese Patent Application No. 2023-166285, filed Sep. 27, 2023, the contents of which are incorporated herein by reference in their entirety.

BACKGROUND OF THE INVENTION

Field of the Invention

The present invention relates to a heating device and a method of manufacturing a magnetic recording medium.

Description of the Related Art

Magnetic recording media are widely used as recording media or recording and storing various data. As a constitution of the magnetic recording media for example, a magnetic layer is formed over a soft magnetic layer, a foundation layer, and the like that are formed on a substrate.

To meet a demand for improvement in the recording density, miniaturization of the structure of the magnetic layer has been studied. In order to improve the recording quality, a material having a high thermal fluctuation resistance, such as an FePt alloy is used as the magnetic layer. When such a material is used, a heat treatment is often performed after the formation of the magnetic layer in the process of manufacturing the magnetic recording medium in order to regularize the magnetic layer.

For example, Japanese Patent Application Laid-Open Publication No. 2002-129326 discloses a film forming apparatus in which one or a plurality of substrate holders for holding a substrate, a thin film material source, and a shutter retractably positioned between the substrate holder and the thin film material source are disposed in a film forming chamber, and the shutter is mounted with one or a plurality of surface heaters for heating the substrate such that the surface heater corresponds to the substrate.

For example, Japanese Patent Application Laid-Open Publication No. 2022-172776 discloses a heating light source apparatus including a plurality of heating light source modules including: a plurality of light emitting elements; and a cooling member.

SUMMARY OF THE INVENTION

It is required to reduce the manufacturing cost of magnetic recording media. Magnetic recording media having a disk shape in which a hole is formed at the center are widely used. Therefore, workpieces in the manufacturing process often have a similar shape.

Japanese Patent Application Laid-Open Publication No. 2002-129326 discloses, as a surface heater, a configuration in which a resistor such as pyrolytic graphite (PG) is formed in a predetermined pattern on an insulating substrate such as pyrolytic boron nitride (PBN). Such a heater is very expensive, leading to an increase in the manufacturing cost of the magnetic recording media. Moreover, it is difficult to control the distribution of the heating amount in the in-plane direction. Therefore, defective products may occur due to excessive heating. In addition, when heating a workpiece having a hole in the center, parts in the apparatus are easily heated by a major quantity of infrared rays passing through the hole, and it takes time and effort to protect the apparatus, adding to the cost.

Japanese Patent Application Laid-Open Publication No. 2022-172776 discloses a configuration using an LED element as a light-emitting element. However, since heat escapes the peripheral end of the substrate during heating, the light-emitting element positioning disclosed in Japanese Patent Application Laid-Open Publication No. 2022-172776 makes the temperature near the outer periphery of the substrate lower than that on the inner region of the substrate.

An object of an embodiment of the present invention is to provide a heating device capable of heating a surface of a workpiece having a disk shape with a hole in the center, at a high productivity and a high uniformity.

In order to achieve the above object, the present invention has the following configuration.

<1> According to an embodiment of the present invention, a heating device for heating a workpiece having a disk shape with a hole in a center and having a pair of main surfaces opposite to each other by irradiating the workpiece with light includes an irradiating part facing at least one main surface of a pair of main surfaces of a workpiece and configured to irradiate the workpiece with light, wherein the irradiating part includes a plurality of light emitting elements on a surface thereof facing the at least one main surface of the workpiece, the surface of the irradiating part facing the workpiece includes a first region including a position corresponding to a center of the workpiece, a second region surrounding the first region from an outer side, and a third region surrounding the second region from an outer side and including a position corresponding to an outer periphery of the workpiece, and an amount of light emission per unit area in the third region is higher than an amount of light emission per unit area in the first region and an amount of light emission per unit area in the second region.

<2> The heating device according to <1> further includes a pair of irradiating parts facing the pair of main surfaces of the workpiece, respectively, wherein each of the pair of irradiating parts is the irradiating part.

<3> In the heating device according to <1>, an outer periphery of the first region, an outer periphery of the second region, an outer periphery of the third region, the outer periphery of the workpiece, and a shape of a hole of the workpiece are concentric circles when viewed in a direction perpendicular to the main surfaces of the workpiece, and in a case where a radius of the workpiece is defined as $R_W$ and a radius of the hole is defined as $R_H$, a radius of the outer periphery of the first region is $0.50R_H$ or more and $0.43R_H+0.57R_W$ or less, a radius of the outer periphery of the second region is $0.40R_H+0.60R_W$ or more and $0.03R_H+0.97R_W$ or less, and a radius of the outer periphery of the third region is $R_W$ or more and $1.5R_W$ or less.

<4> In the heating device according to <1> or <2>, the number of the light emitting elements provided per unit area in the third region is greater than the number of the light emitting elements provided per unit area in the first region and the number of the light emitting elements provided per unit area in the second region.

<5> The heating device according to any one of <1> to <3> further includes a controller configured to control light emission of the light emitting elements, wherein the controller performs control of selecting the light emitting elements that are to be caused to emit light among the plurality of light emitting elements in each of the first to third regions.

<6> The heating device according to any one of <1> to <3> further includes a controller configured to control light emission of the light emitting elements, wherein the controller controls the amount of light emission of the light emitting elements in each of the first to third regions.

<7> In the heating device according to <6>, the controller issues a command for adjusting the amount of light emission of the light emitting elements in each of the first to third regions, and the heating device further includes: a first driver configured to control the amount of light emission of the light emitting elements provided in the first region based on the command from the controller; a second driver configured to control the amount of light emission of the light emitting elements provided in the second region based on the command from the controller; and a third driver configured to control the amount of light emission of the light emitting elements provided in the third region based on the command from the controller.

<8> In the heating device according to any one of <1> to <3>, the amount of light emission per unit area in the second region is greater than the amount of light emission per unit area in the first region.

<9> In the heating device according to <8>, $L_1/L_2$ is 0.70 or less, and $L_2/L_3$ is 0.050 or more and 0.80 or less, where $L_1$ is the amount of light emission per unit area in the first region, $L_2$ is the amount of light emission per unit area in the second region, and $L_3$ is the amount of light emission per unit area in the third region.

<10> In the heating device according to <8>, the number of the light emitting elements provided per unit area in the second region is greater than the number of the light emitting elements provided per unit area in the first region.

<11> The heating device according to <10>, $N_1/N_2$ is 0.70 or less, and $N_2/N_3$ is 0.050 or more and 0.80 or less, where $N_1$ is the number of the light emitting elements provided per unit area in the first region, $N_2$ is the number of the light emitting elements provided per unit area in the second region, and $N_3$ is the number of the light emitting elements provided per unit area in the third region.

<12> The heating device according to <8>, further includes a controller configured to control light emission of the light emitting elements, wherein the controller performs control of selecting the light emitting elements that are to be caused to emit light among the plurality of light emitting elements in each of the first to third regions.

<13> The heating device according to <8>, further includes a controller configured to control light emission of the light emitting elements, wherein the controller controls the amount of light emission of the light emitting elements in each of the first to third regions.

<14> According to another embodiment of the present invention, a method of manufacturing a magnetic recording medium including forming a magnetic layer on a workpiece having a disk shape with a hole in a center and having a pair of main surfaces opposite to each other includes after the forming:

heating the workpiece by irradiating the workpiece with light, wherein the heating is performed by irradiating at least one main surface of the pair of main surfaces of the workpiece with light by an irradiating part including a plurality of light emitting elements on a surface of the irradiating part facing the at least one main surface of the workpiece, the surface of the irradiating part facing the workpiece includes a first region including a position corresponding to the center of the workpiece, a second region surrounding the first region from an outer side, and a third region surrounding the second region from an outer side and including a position corresponding to an outer periphery of the workpiece, and an amount of light emission per unit area in the third region is greater than an amount of light emission per unit area in the first region and an amount of light emission per unit area in the second region.

According to an embodiment of the present invention, it is possible to provide a heating device capable of heating a surface of a workpiece having a disk shape with a hole in the center, at a high productivity and a high uniformity.

BRIEF DESCRIPTION OF THE DRAWINGS

FIG. 3 is a diagram exemplarily illustrating an example of an apparatus for manufacturing a magnetic recording medium according to the first embodiment of the present invention;

FIG. 4 is an exemplary plan view illustrating an example of a configuration of a heating device according to the first embodiment of the present invention;

FIG. 7 is a conceptual diagram illustrating an example of a configuration for controlling the irradiating part illustrated in FIG. 6;

DETAILED DESCRIPTION OF THE DISCLOSURE

Figure 1:
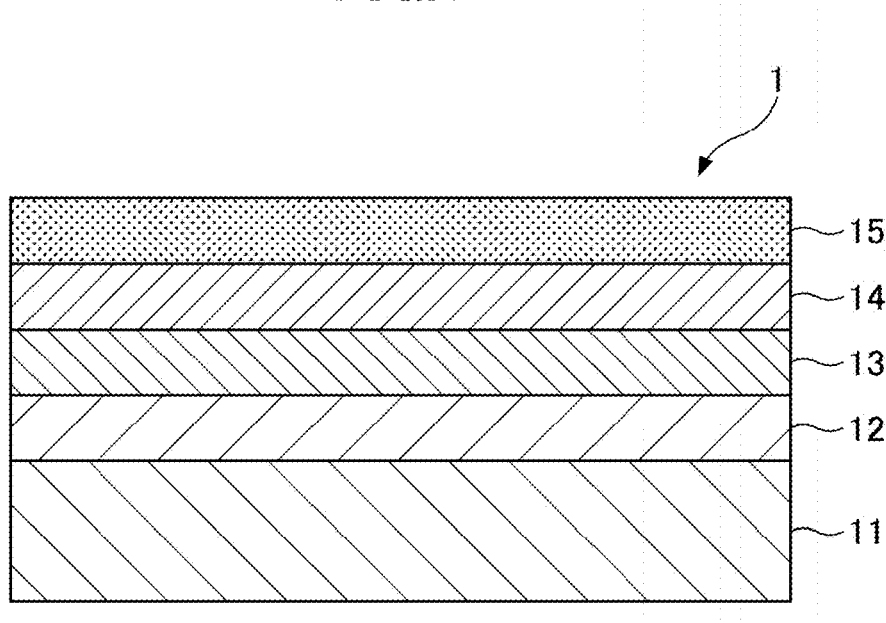
FIG. 1 is a schematic cross-sectional view illustrating an example of a configuration of a magnetic recording medium obtained by a method of manufacturing a magnetic recording medium according to a first embodiment of the present invention.

Hereinafter, an embodiment of the present invention will be described in detail with reference to the drawings. However, the present invention is not limited to the configuration described below. In the drawings used in the following description, for the sake of convenience, feature parts may be illustrated while being enlarged, and the dimensional ratios and the like of the constituent elements may not always be the same as the reality.

The term "workpiece" generally refers to a material state during a period in which a substrate 11 becomes a magnetic recording medium 1 as described below. The state as the substrate 11 and the state as the magnetic recording medium 1 may also be referred to as a workpiece.

First Embodiment

<Structure of a Magnetic Recording Medium>

FIG. 1 is a schematic cross-sectional view illustrating an example of the layer structure of a magnetic recording medium obtained by a method of manufacturing a magnetic recording medium according to this embodiment. It is preferable that the magnetic recording medium described below is suitable for a perpendicular magnetic recording system, but may be suitable for other magnetic recording systems.

The magnetic recording medium 1 according to this example includes a substrate 11, and a soft magnetic layer 12, a foundation layer 13, a magnetic layer 14, and a protective layer 15 that are formed on the substrate 11 in an order from the substrate 11 side. These layers may be formed on one main surface of the substrate 11, or on both main surfaces.

The configuration of the magnetic recording medium 1 obtained by the manufacturing method according to this embodiment is not limited to this configuration, and layers other than the magnetic layer 14 and the foundation layer 13 do not need to be formed if they are not necessary, or layers other than the layers mentioned above may be formed as needed.

In FIG. 1, for convenience of explanation, the protective layer 15 side may be referred to as the upper side or the outer surface side, and the substrate 11 side may be referred to as the lower side or the inner side.

The shape of the substrate 11 is preferably a disk shape with a hole in the center. The material constituting the substrate 11 is preferably a nonmagnetic material. Examples of the material constituting the substrate 11 include an A1 alloy, crystallized glass, amorphous glass, and the like. The substrate 11 may have a configuration in which a coating layer is formed on the substrate by plating or the like.

The soft magnetic layer 12 is provided on the substrate 11 and has a function of guiding a recording magnetic field from a magnetic head such that a perpendicular component of the recording magnetic field is efficiently applied to the magnetic layer 14 during recording of a signal on the magnetic recording medium 1. Examples of the material constituting the soft magnetic layer 12 include a soft magnetic alloy such as an FeCo alloy, a CoZrNb alloy, a CoTaZr alloy, and the like.

The soft magnetic layer 12 preferably has an amorphous structure. This can enhance the soft magnetic characteristic of the soft magnetic layer 12 and improve the surface smoothness, such that the floating height of the magnetic head can be reduced and the recording density of the magnetic recording medium 1 can be further improved.

The soft magnetic layer 12 may be made of one layer or may include a plurality of layers. When the soft magnetic layer 12 includes a plurality of layers forming antiferromagnetic exchange coupling (AFC) films, it is preferable that a nonmagnetic layer such as a Ru film is formed between the layers.

The total thickness of the soft magnetic layer 12 is suitably determined by the electromagnetic conversion characteristics of the magnetic recording medium 1, yet is preferably, for example, from 20 nm to 120 nm.

The foundation layer 13 promotes orientation of the magnetic particles contained in the magnetic layer 14. When the magnetic layer 14 includes magnetic particles having the $L1_0$ structure, it is preferable that the foundation layer 13 is capable of realizing (001) orientation of the magnetic particles.

Examples of the material contained in the foundation layer 13 include a NaCl type compound, a bcc alloy, or the like. Examples of the NaCl type compound include MgO. Examples of the bcc alloy include Cr alloy, W alloy, Mo alloy, and the like.

The foundation layer 13 may be made of one layer or may include a plurality of layers. When the foundation layer 13 includes a plurality of layers, it is preferable that a lower layer contains a bcc alloy and an uppermost layer contains a NaCl type compound. However, the foundation layer is not limited to this.

The magnetic layer 14 includes magnetic particles and is a layer in which information is recorded. The magnetic particles preferably have the $L1_0$ structure. Examples of magnetic particles having the $L1_0$ structure include FePt alloy particles containing an FePt alloy, CoPt alloy particles containing a CoPt alloy, and the like. The magnetic layer 14 preferably has a granular structure.

The magnetic layer 14 may be made of one layer or may include a plurality of layers. When the magnetic layer 14 includes a plurality of layers, the layers may be formed using the same type of a material or different types of materials. A non-magnetic layer may be included between the magnetic layers 14 of the plurality of magnetic layers 14. The non-magnetic layer may be formed using a common material used in a magnetic recording medium.

The protective layer 15 protects the underlying layers such as the magnetic layer 14 and the like from contact between a part such as a magnetic head and the magnetic recording medium 1. Examples of the material for forming the protective layer 15 include a carbon material such as Diamond Like Carbon (DLC).

The magnetic recording medium 1 may include a lubricant layer (not illustrated) on the protective layer 15. Examples of the material for forming the lubricant layer include a resin such as perfluoropolyether.

<Method of Manufacturing a Magnetic Recording Medium>

Figure 2:
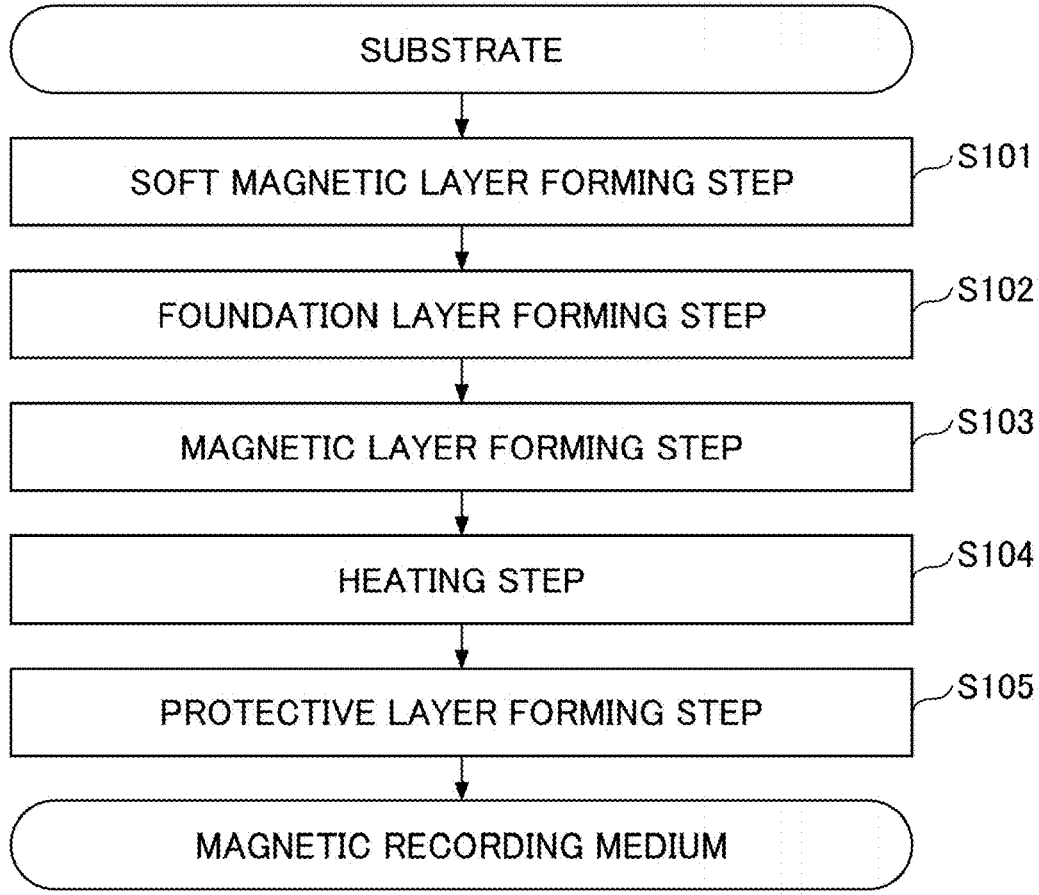
FIG. 2 is a flowchart illustrating an example of a method of manufacturing a magnetic recording medium according to the first embodiment of the present invention.

FIG. 2 is a flowchart illustrating an example of a method of manufacturing the magnetic recording medium 1 according to the first embodiment of the present invention. The method of manufacturing the magnetic recording medium 1 according to an example of the present embodiment includes a soft magnetic layer forming step S101, a foundation layer forming step S102, a magnetic layer forming step S103, a heating step S104, and a protective layer forming step S105.

The method of manufacturing the magnetic recording medium 1 according to the present embodiment may include other steps as needed. Further, the method of the manufacturing magnetic recording medium 1 according to the present embodiment does not need to perform at least any of the steps other than the magnetic layer forming step S103 and the heating step S104 depending on the specifications of the magnetic recording medium. Further, the process performed in the heating step S104 (described below in detail) may be performed after the steps other than the magnetic layer forming step S103.

In the soft magnetic layer forming step S101, the soft magnetic layer 12 is formed on a main surface of the substrate 11. The configurations of the substrate 11 and the soft magnetic layer 12 are as described above.

Examples of the method for forming the soft magnetic layer 12 include Direct Current (DC) sputtering and the like, but the method is not limited to these methods. When the soft magnetic layer 12 includes a plurality of layers, the layers may be formed by the same method or different methods. In order to improve a close-contacting property of the soft magnetic layer with the substrate 11 (workpiece W), a close-contact layer may be formed before the soft magnetic layer forming step S101.

In the foundation layer forming step S102, the foundation layer 13 is formed on the workpiece W on which the soft magnetic layer 12 has been formed. The configuration of the foundation layer 13 is as described above.

Examples of the method for forming the foundation layer 13 include DC sputtering and the like, but the method is not limited to these methods. When the foundation layer 13 includes a plurality of layers, the layers may be formed by the same method or different methods.

In the magnetic layer forming step S103, the magnetic layer 14 is formed on the workpiece W on which the foundation layer 13 is formed. The configuration of the magnetic layer 14 is as described above.

Examples of the method for forming the magnetic layer 14 include DC sputtering and the like, but the method is not limited to these methods. When the magnetic layer 14 includes a plurality of layers, the layers may be formed by the same method or different methods.

In the heating step S104, in the example illustrated in FIG. 2, the workpiece W on which the magnetic layer 14 is formed is irradiated with light to heat the workpiece W. The crystal orientation of the magnetic layer 14 is enhanced by the heating step S104. Details of the heating method will be described below. After the heating step S104, the workpiece W may be cooled as needed.

In a case of forming a plurality of layers as the magnetic layer 14, it is preferable that the heating process according to the method performed in the heating step S104 is performed after formation of at least any one layer, and preferably after formation of at least the lowermost layer. The heating process according to the method performed in the heating step S104 may be performed each time one magnetic layer 14 is formed.

In the protective layer forming step S105, the protective layer 15 is formed on the workpiece W that has undergone the heating step S104. The configuration of the protective layer 15 is as described above. Examples of the method for forming the protective layer 15 include Chemical Vapor Deposition (CVD) and the like, but the method is not limited to these methods.

The workpiece W on which the protective layer 15 is formed may be further subjected to surface treatment, formation of a lubricant layer, or other treatments.

<Apparatus for Manufacturing a Magnetic Recording Medium>

Figure 3:
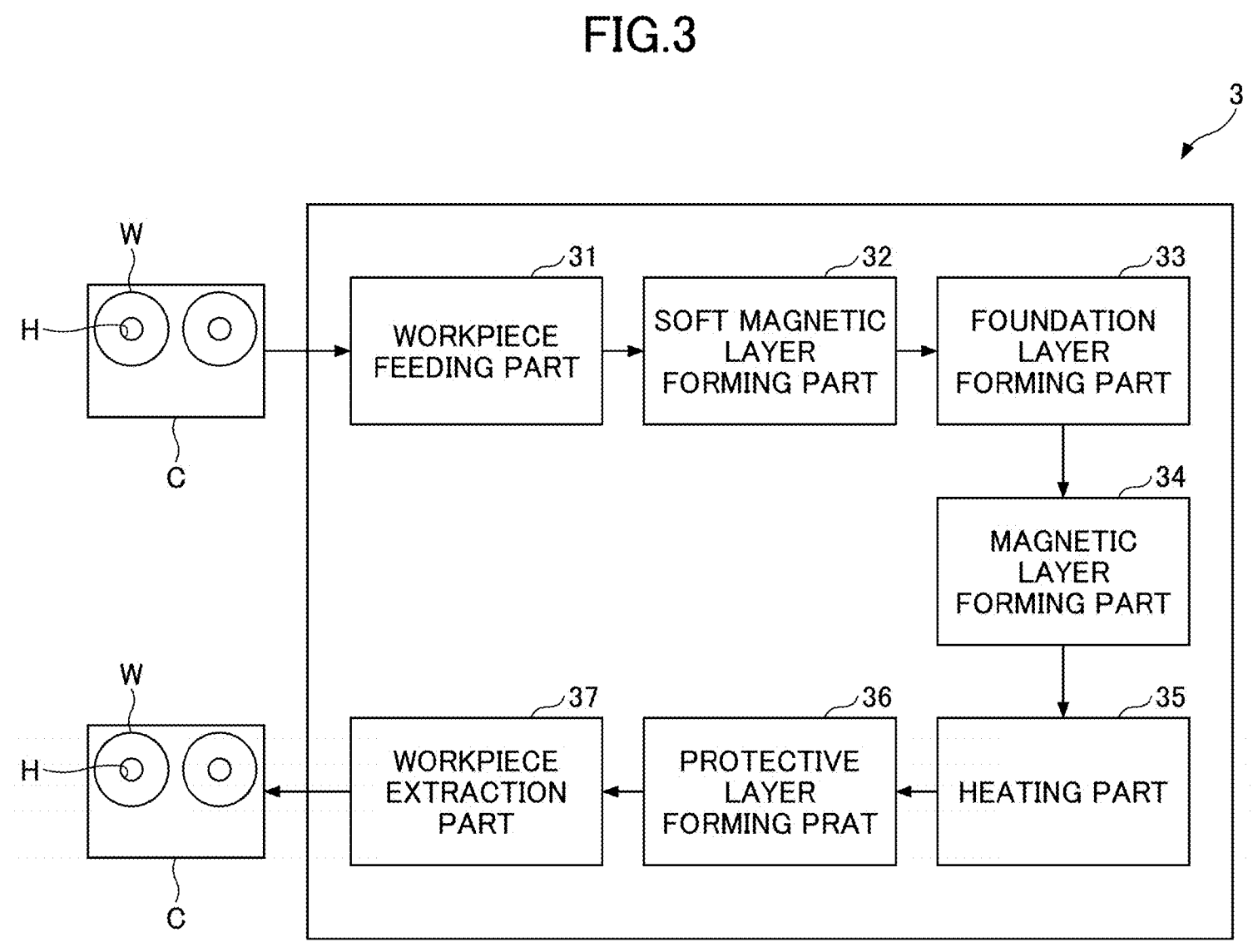

FIG. 3 is a diagram exemplarily illustrating an example of an apparatus for manufacturing the magnetic recording medium 1 according to the first embodiment of the present invention. An apparatus 3 (hereinafter, may be referred to as the manufacturing apparatus 3) for manufacturing the magnetic recording medium 1 according to an example of the present embodiment includes a workpiece feeding part 31, a soft magnetic layer forming part 32, a foundation layer forming part 33, a magnetic layer forming part 34, a heating part 35, a protective layer forming part 36, and a workpiece extraction part 37.

The apparatus 3 according to the present example is an in-line type manufacturing apparatus configured to perform all processes, to which the workpiece W is subjected, in a chamber. In FIG. 3, an arrow indicates a direction in which the workpiece W moves within the apparatus 3. The workpiece feeding part 31, the soft magnetic layer forming part 32, the foundation layer forming part 33, the magnetic layer forming part 34, the heating part 35, the protective layer forming part 36, and the workpiece extraction part 37 may each include chambers in which film-forming processes are performed on the workpiece W. In the apparatus 3, the workpiece W fed from the workpiece feeding part 31 is passed through the respective chambers of the apparatus 3 while being carried by a carrier C, and extracted to outside the apparatus 3 via the workpiece extraction part 37. Note that this configuration is merely an example, and the apparatus 3 for manufacturing the magnetic recording medium 1 according to the present embodiment is not limited to the in-line type.

The workpiece W according to the present embodiment has a disk shape with a hole H in the center. It is preferable that the hole H is circular, and it is more preferable that the center of the hole H coincides with the center of the workpiece W.

The radius of the workpiece W is preferably 25 mm or more, more preferably 40 mm or more, and yet more preferably 45 mm or more. The radius of the workpiece W is preferably 80 mm or less, more preferably 60 mm or less, and yet more preferably 50 mm or less.

The radius of the hole H is preferably 6.0 mm or more, more preferably 8.0 mm or more, and yet more preferably 10 mm or more. The radius of the hole H is preferably 20 mm or less, more preferably 17 mm or less, and more preferably 14 mm or less.

The workpiece feeding part 31 has an opening/closing mechanism, and the opening/closing mechanism is opened when feeding the workpiece W (substrate 11) into the manufacturing apparatus 3. An example of a specific configuration of the workpiece feeding part 31 includes a load chamber (not illustrated).

The load chamber is opened so as to communicate with the outside of the manufacturing apparatus 3 when feeding the workpiece W. When the workpiece W is fed into the load chamber, the interior of the load chamber is closed and depressurized. For example, the depressurization is performed by a depressurizing device such as a pump. When the pressure in the load chamber is sufficiently lowered, the load chamber is opened so as to communicate with the interior of the manufacturing apparatus 3, in the example of the drawing, with the soft magnetic layer forming part 32, such that the workpiece W is conveyed into the soft magnetic layer forming part 32.

With this configuration, the interior of the manufacturing apparatus 3 is kept in a depressurized state. The configuration and operation of the workpiece feeding part 31 described here are merely an example, and are not limited to these. In order to further enhance the airtightness inside the manufacturing apparatus 3, the workpiece feeding part 31 may include a plurality of chambers connected in series, for example, a load chamber and a load sub-chamber.

The soft magnetic layer forming step S101 is performed in in the soft magnetic layer forming part 32, the foundation layer forming step S102 is performed in in the foundation layer forming part 33, and the magnetic layer forming step S103 is performed in the magnetic layer forming part 34, and the respective steps are as described above.

Each of the soft magnetic layer forming part 32, the foundation layer forming part 33, and the magnetic layer forming part 34 may be configured to form only one layer, or may be configured to form two or more layers. It is preferable that the layer stacking process for stacking each layer in the soft magnetic layer forming part 32, the foundation layer forming part 33, and the magnetic layer forming part 34 is performed in a chamber. In any part in which a plurality of layers are formed among these parts, it is preferable that respective layers are formed in different chambers. That is, it is preferable that each part includes chambers corresponding in number to the number of layers to be formed therein.

Each chamber may independently include a depressurizing device. The depressurizing device is not particularly limited. Examples of the depressurizing device include a pump and the like.

In the heating part 35, the heating step S104 is performed. The heating step S104 is as described above. The heating part 35 includes a heating device. Details of the configuration of the heating device will be described below.

In the protective layer forming part 36, the protective layer forming step S105 is performed. The protective layer forming step S105 is as described above. It is preferable that the layer stacking process in the protective layer forming part 36 is performed in a chamber. When forming a plurality of layers as the protective layer 15, it is preferable that the respective layers are formed in different chambers. That is, it is preferable that the protective layer forming part 36 includes chambers corresponding in number to the number of layers to be formed therein. Each chamber may independently include a depressurizing device. The depressurizing device is not particularly limited. Examples of the depressurizing device include a pump and the like.

The workpiece extraction part 37 has an opening/closing mechanism. When extracting the workpiece W to outside the manufacturing apparatus 3, the opening/closing mechanism is opened. An example of a specific configuration of the workpiece extraction part 37 is an unload chamber (not illustrated).

When conveying the workpiece W from the protective layer forming part 36 to the workpiece extraction part 37, the unload chamber is opened. When the workpiece W is conveyed into the unload chamber, the opening/closing mechanism between the unload chamber and the protective layer forming part 36 is closed, and then the pressure in the unload chamber is increased. When the pressure in the unload chamber has risen sufficiently, the unload chamber becomes able to communicate with the outside, and the workpiece W is extracted to outside the manufacturing apparatus 3. The pressure in the unload chamber when it is able to communicate with the outside is not limited, yet it is preferable that the pressure has risen to the open-air pressure.

<Heating Device>

Figure 4:
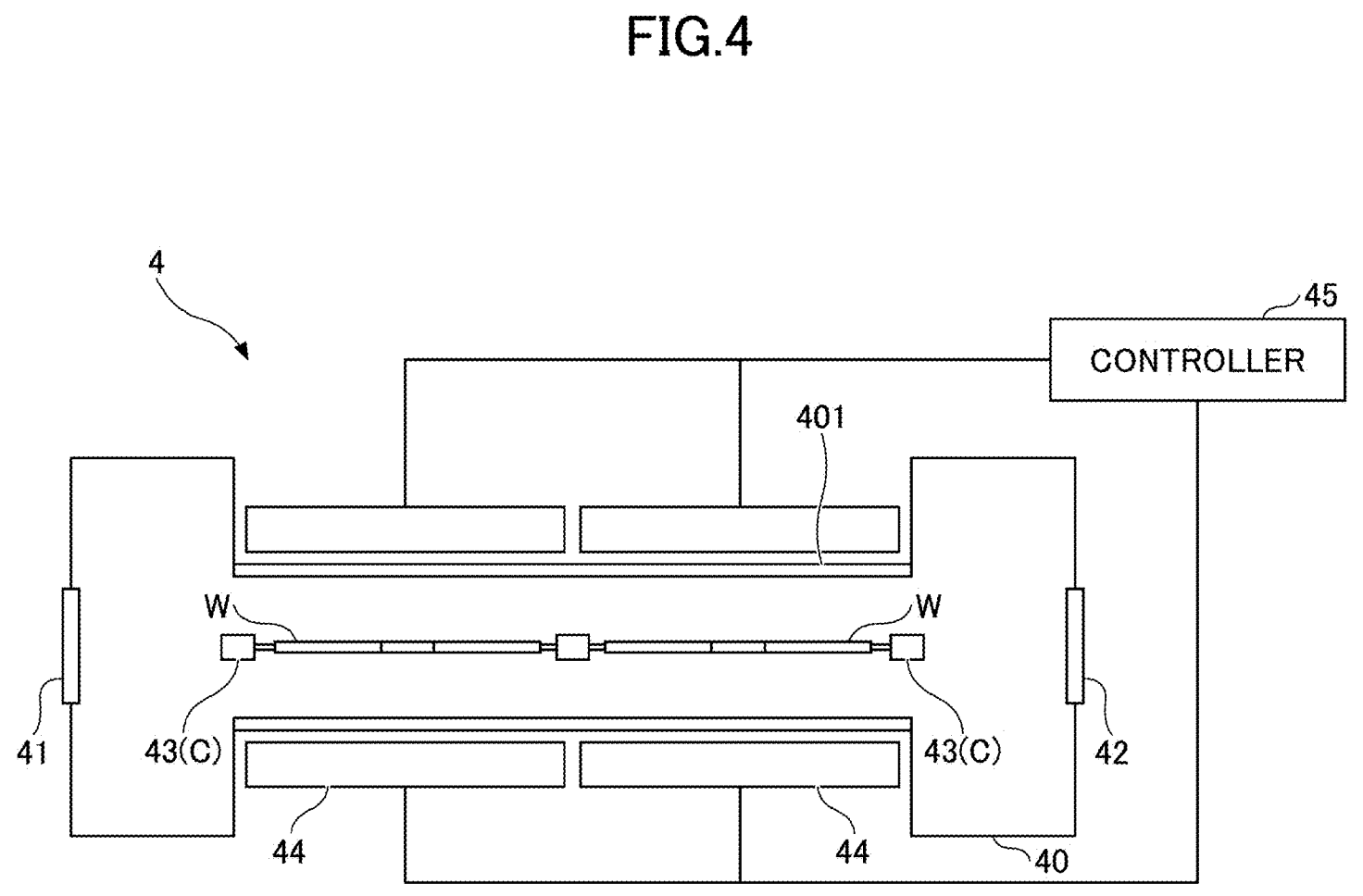

FIG. 4 is an exemplary plan view illustrating an example of the configuration of the heating device according to the first embodiment of the present invention. The heating device 4 according to the present embodiment is configured to heat a workpiece W having a disk-like shape with a hole in the center and having a pair of main surfaces opposite to each other, by irradiating the workpiece W with light. The heating device 4 is provided in the heating part 35 in the example illustrated in FIG. 3. Although the heating device 4 is an example of a device used for implementing the above-described heating method (heating step), the heating device 4 and the above-described heating method do not need to be suited to each other.

The heating device 4 according to the example illustrated in FIG. 4 includes a chamber 40, a workpiece carry-in part 41, a workpiece carry-out part 42, a workpiece holding part 43, irradiating parts 44, and a controller 45. Note that the configuration described below is only an example, and the heating device 4 according to the present embodiment is not limited to this configuration.

When heating the workpiece W, it is preferable that the chamber 40 is kept in a depressurized state lower than the open-air pressure. The chamber 40 is connected to a depressurizing device (not illustrated). Examples of the depressurizing device include a pump and the like. Note that this configuration is only an example, and the chamber 40 does not need to be connected to the depressurizing device when the heating does not need to be performed in a depressurized environment or when the entire path for the workpiece W in the apparatus 3 for manufacturing the magnetic recording medium 1 is depressurized as a whole.

The air pressure in the chamber 40 in the depressurized state is not limited, yet is preferably 10 Pa or lower. This is for inhibiting heat loss caused by a gas in the chamber 40 being heated. This is also for inhibiting the walls of the chamber 40 and components or the like in the chamber 40 from being heated due to heat transfer via a gas in the chamber 40. Further, this is for inhibiting the air pressures in the preceding and succeeding chambers from rising when moving the workpiece W, in a case where the preceding and succeeding chambers are kept in a depressurized state.

The chamber 40 is equipped with irradiation windows 401 between the irradiating parts 44 and the workpiece W, and the irradiation windows 401 constitute parts of partition walls sectioning the interior and the exterior of the chamber 40. That is, in the configuration of this example, the workpiece W is inside the chamber 40, and the irradiating parts 44 are outside the chamber 40. The irradiation windows 401 are transmissive to light from the irradiating parts 44. Examples of the material of the irradiation windows 401 include quartz.

According to this configuration, it is possible to inhibit a rise in the pressure in the chamber 40 due to a gas or the like generated when a light-emitting element 44L (described below in detail) provided in the irradiating parts 44 emits light, or to inhibit contamination or the like in the chamber 40.

The workpiece carry-in part 41 is opened when carrying the workpiece W into the chamber 40, and is closed upon completion of carrying the workpiece W into the chamber 40. The workpiece carry-out part 42 is closed during heating of the workpiece W, and is opened when carrying the workpiece W out of the chamber 40. That is, in the heating step of the workpiece W, the workpiece carry-in part 41 and the workpiece carry-out part 42 are closed. In order to maintain the interior of the chamber 40 at a predetermined air pressure in the heating step, the interior of the chamber 40 may be depressurized by a depressurizing device or the like with the workpiece carry-in part 41 and the workpiece carry-out part 42 closed.

The workpiece holding part 43 holds the workpiece W at a predetermined position so that the main surface of the workpiece W faces the irradiating part 44 described below. In the configuration illustrated in FIG. 4, the workpiece holding part 43 holds two workpieces W, but the number of workpieces W held by the workpiece holding part 43 is not limited.

In this example, as an example, the workpiece W is configured to be moved between the chambers while being held by the carrier C. That is, in this example, the carrier C corresponds to the workpiece holding part 43. In the heating step, the carrier C stops at a position where the main surface of each workpiece W faces a corresponding irradiating part 44.

The irradiating part 44 faces at least one main surface of a pair of main surfaces of the workpiece W and irradiates the workpiece W with light. In this example, a pair of irradiating parts 44 are provided to face the pair of main surfaces (both main surfaces) of the workpiece W, respectively, and have the same configuration. Each of the irradiating parts 44 irradiates a corresponding main surface (a main surfaces that it faces) of the workpiece W with light. However, this configuration is only an example, and, for example, the irradiating part 44 may be provided only on one main surface side of the workpiece W. For example, when a pair of irradiating parts 44 are provided to face the pair of main surfaces of the workpiece W, respectively, the irradiating part 44 facing one main surface (front surface) of the workpiece W and the irradiating part 44 facing the other main surface (back surface) thereof may have different configurations. Details of the configuration of the irradiating part 44 will be described below.

The controller 45 issues commands for controlling light emission (turning on and off) of the light emitting element 44L provided in the irradiating part 44. The controller 45 includes a storage unit, a calculation unit, and an interface, which are not illustrated here. The controller 45 may have other configurations.

The storage unit may include, for example, a ROM or a RAM, and the storage unit may include a plurality of devices. The calculation unit may include, for example, a CPU or an MPU, and the calculation unit may include a plurality of devices. The interface performs exchange of signals between the inside of the controller 45 and external devices. A plurality of interfaces may be provided in accordance with the type and number of external devices.

In the controller 45, for example, the calculation unit executes a program stored in the storage unit while referring to various types of information, thereby generating signals for operating each part of the heating device 4. The various types of information include, for example, a user input, a signal from a sensor provided at each part of the heating device 4, and data stored in the storage unit. The signal generated by the controller 45 is transmitted to a driver described below via, for example, the interface. The signal generated by the controller 45 may be transmitted to each part of the heating device 4 via the interface or the like.

For example, when the sensor detects that the workpiece carry-in part 41 and the workpiece carry-out part 42 are closed and that the workpiece W is at a predetermined position at which the heating process is performed, the controller 45 controls the depressurizing device to decompress the interior of the chamber 40 based on the signal from the sensor.

For example, in a case where the chamber 40 is equipped with a pressure sensor, when the pressure sensor detects that the air pressure in the chamber 40 has fallen below a predetermined value, the controller 45 generates and transmits a signal for causing the light emitting element 44L described below to emit light, based on the signal from the pressure sensor.

<Configuration of the Irradiating Part>

Figure 5:
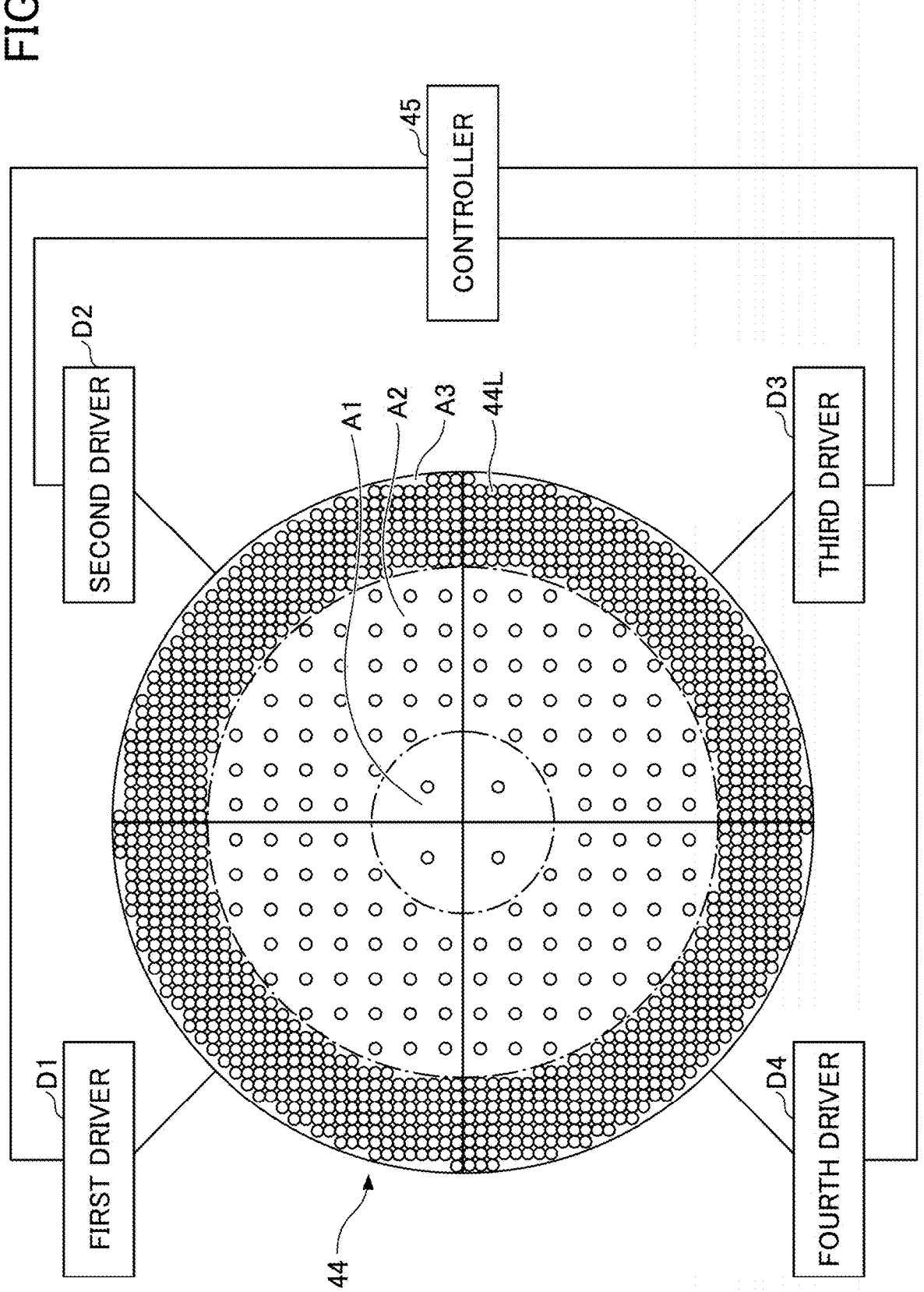
FIG. 5 is an exemplary diagram illustrating an example of a configuration of an irradiating part of a heating device according to the first embodiment of the present invention as viewed from the workpiece side in a direction perpendicular to a main surface of the workpiece.

FIG. 5 is an exemplary view illustrating an example of the configuration of the irradiating part 44 of the heating device 4 according to the first embodiment of the present invention, as viewed from the workpiece side in the direction perpendicular to the main surface of the workpiece. The irradiating part 44 includes a plurality of light emitting elements 44L, a first driver D1, a second driver D2, a third driver D3, and a fourth driver D4.

The light emitting elements 44L are provided on a surface of the irradiating part 44 facing at least one main surface of the workpiece. Here, facing the main surface of the workpiece W encompasses facing any planes that are extensions of the main surface of the workpiece W, including an extension to the radially outer side of the workpiece W and an extension to the hole H in a projection in the direction perpendicular to the main surface of the workpiece W. In the following description, the position of a light emitting element 44L means the center position of the light emitting part of the light emitting element 44L. This applies to any embodiments and modifications described below. FIG. 5 illustrates one of the irradiating parts 44 illustrated in FIG. 4. In the following description, the irradiating part 44 means one irradiating part 44 unless otherwise particularly noted. Of the pair of main surfaces of the workpiece W, the main surface on the side facing the irradiating part 44 is referred to as the "main surface of the workpiece W".

The light emitting element 44L is preferably an LED, but is not limited to an LED. It is preferable that all light-emitting elements 44L are equidistant from the plane including the main surface of the workpiece W. In this example, the light emitting elements 44L are mounted on a surface parallel with the main surface of the workpiece W.

The distance D between the light emitting elements 44L and the plane including the main surface of the workpiece W is preferably 2.0 times or less, more preferably 1.5 times or less, and yet more preferably 1.0 times or less the radius $R_W$ of the outer periphery of the workpiece W. This is for efficiently irradiating the workpiece W with light with respect to the amount of light emitted by the light emitting elements 44L.

The distance D between the light emitting element 44L and the plane including the main surface of the workpiece W is preferably 0.050 times or more, more preferably 0.10 times or more, and yet more preferably 0.20 times or more the radius $R_W$ of the outer periphery of the workpiece W. This is for inhibiting unevenness in the amount of light irradiation on the surface of the workpiece W.

When the light emitting element 44L is a directional light source, it is preferable that the direction in which the light emission intensity is the highest is normal to the plane including the main surface of the workpiece W. In this specification, it is assumed that a given structure or position and a structure or position overlapping the given structure or position in a projection perpendicular to the main surface of the workpiece W are in a corresponding relationship.

In the projection in the direction perpendicular to the main surface of the workpiece W, it is preferable that the irradiating part 44 includes a light emitting element 44L at either or both of a position corresponding to an end of the workpiece W and a position corresponding to the radially outer side of the workpiece W. This is for irradiating also the end of the workpiece W with light sufficiently.

The surface of the irradiating part 44 facing the main surface of the workpiece W includes a first region A1 including a position corresponding to the center of the workpiece W, a second region A2 surrounding the first region A1 from the outer side, and a third region A3 surrounding the second region A2 from the outer side and including a position corresponding to the outer periphery of the workpiece W, and the amount of light emission per unit area in the third region A3 is higher than the amount of light emission per unit area in the first region A1 and the amount of light emission per unit area in the second region A2. This is for sufficiently heating the outer peripheral end of the workpiece W since heat easily escapes the outer peripheral end of the workpiece W. The amount of light emission per unit area in a certain region is a value obtained by dividing the total amount of light emitted by the light emitting elements 44L positioned in the region by the area of the region.

In addition to the above configuration, it is preferable that the amount of light emission per unit area in the second region A2 is higher than the amount of light emission per unit area in the first region A1.

Here, the amount of light emission per unit area in the first region A1 is defined as $L_1$, the amount of light emission per unit area in the second region A2 is defined as $L_2$, and the amount of light emission per unit area in the third region A3 is defined as $L_3$.

$L_1/L_2$ is preferably 0.70 or less, more preferably 0.50 or less, and yet more preferably 0.30 or less. This is for suppressing an excessive temperature rise in a portion of the workpiece W close to the hole H since this portion would be readily heated, and for inhibiting a component or the like in the chamber 40 described below from being heated by light passing through the hole H. Note that $L_1/L_2$ may be 0. That is, no light emitting element 44L may be provided in the first region A1.

$L_2/L_3$ is preferably 0.80 or less, more preferably 0.60 or less, and yet more preferably 0.40 or less. This is for more efficiently heating the workpiece W around the outer periphery thereof by adjusting the amount of light emission from the third region A3 to be higher than the amount of light emission from the second region A2, since heat easily escapes the peripheral end of the workpiece W. $L_2/L_3$ is preferably 0.050 or more, more preferably 0.10 or more, and yet more preferably 0.20 or more. This is for suppressing the outer side of the workpiece W from being excessively heated. The upper limit value and the lower limit value of $L_2/L_3$ may be combined desirably. In the present specification, the same applies to the combination of the upper limit value and the lower limit value of other structural requirements.

For this purpose, for example, the number of light emitting elements 44L provided per unit area in the third region A3 is adjusted to be larger than the number of light emitting elements 44L provided per unit area in the first region A1 and the number of light emitting elements 44L provided per unit area in the second region A2.

For this purpose, for example, as illustrated in FIG. 5, the number of light emitting elements 44L provided per unit area in the second region A2 is adjusted to be larger than the number of light emitting elements 44L provided per unit area in the first region A1.

The number of light emitting elements 44L provided in the second region A2 is preferably 80 or more, more preferably 160 or more, and yet more preferably 240 or more. This is to suppress unevenness in the amount of light irradiation on the workpiece W.

The number of light emitting elements 44L provided in the third region A3 is preferably 240 or more, more preferably 480 or more, and yet more preferably 720 or more. This is to suppress unevenness in the amount of light irradiation on the workpiece W.

Here, the number of light emitting elements 44L provided per unit area in each region is a value obtained by dividing the total number of light emitting elements 44L provided in each region by the area of the region. In FIG. 5, the light emitting elements 44L are provided at equal intervals in each region, but this is non-limiting, and patterns or the like may be formed.

The number of light emitting elements 44L provided per unit area in the first region A1 is defined as $N_1$, the number of light emitting elements 44L provided per unit area in the second region A2 is defined as $N_2$, and the number of light emitting elements 44L provided per unit area in the third region A3 is defined as $N_3$.

$N_1/N_2$ is preferably 0.70 or less, more preferably 0.50 or less, and yet more preferably 0.30 or less. This is for suppressing an excessive temperature rise in a portion of the workpiece W close to the hole H since this portion would be readily heated, and for inhibiting a component or the like in the chamber 40 described below from being heated by light passing through the hole H. Note that $N_1/N_2$ may be 0. That is, no light-emitting element 44L may be provided in the first region A1.

$N_2/N_3$ is preferably 0.80 or less, more preferably 0.60 or less, and yet more preferably 0.40 or less. This is for more efficiently heating the workpiece around the outer periphery thereof by adjusting the amount of light emission from the third region A3 to be higher than the amount of light emission from the second region A2, since heat easily escapes the peripheral end of the workpiece W. $N_2/N_3$ is preferably 0.050 or more, more preferably 0.10 or more, and yet more preferably 0.20 or more. This is to suppress the outer side of the workpiece W from being excessively heated.

Assuming that the number of light emitting elements 44L provided per unit area in the m-th region Am other than the first region A1 (where m is 2, 3, or other (for example, m is 21, 22, and the like; details will be described below)) is $N_m$ (unit: number of light emitting elements/cm$^2$), $1/N_m$ (unit: cm$^2$/light emitting element) indicates the area occupied per one light emitting element 44L. In this embodiment, it is preferable that at least one light emitting element 44L is present in a circle contained within the m-th region Am and having an area of $25/N_m$, i.e., a circle having an area that is 25 times $1/N_m$. It is more preferable that at least one light emitting element 44L is present in a circle contained within the m-th region Am and having an area of $12/N_m$. It is yet more preferable that at least one light emitting element 44L is present in a circle contained within the m-th region Am and having an area of $8.0/N_m$. This is to suppress unevenness in the amount of light irradiation on the workpiece W.

In a projection in the direction perpendicular to the main surface of the workpiece W, it is preferable that the outer periphery of the first region A1, the outer periphery of the second region A2, the outer periphery of the third region A3, the outer periphery of the workpiece W, and the shape of the hole H (i.e., the inner periphery of the workpiece W) are concentric circles when viewed in the direction perpendicular to the main surface of the workpiece W. Unless otherwise particularly noted in the following description, the length and shape represent the length and shape in a projection in the direction perpendicular to the main surface of the workpiece W.

When the radius of the outer periphery of the first region A1 is defined as $R_{A1}$, the radius of the outer periphery of the second region A2 is defined as $R_{A2}$, the radius of the outer periphery of the third region A3 is defined as $R_{A3}$, the radius of the workpiece W is defined as $R_W$, and the radius of the hole H is defined as $R_H$, the radius $R_{A1}$ of the outer periphery of the first region A1 is preferably $0.50R_H$ or more. The radius $R_{A1}$ of the outer periphery of the first region A1 is preferably $0.43R_H+0.57R_W$ or less, and more preferably $0.56R_H+0.44R_W$ or less. The radius $R_{A1}$ of the outer periphery of the first region A1 is most preferably $0.70R_H+0.30R_W$.

In this case, the radius $R_{A2}$ of the outer periphery of the second region A2 is preferably $0.40R_H+0.60R_W$ or more, and more preferably $0.33R_H+0.67R_W$ or more. The radius $R_{A2}$ of the outer periphery of the second region A2 is preferably $0.03R_H+0.97R_W$ or less, more preferably $0.10R_H+0.90R_W$ or less. The radius $R_{A2}$ of the outer periphery of the second region A2 is most preferably $0.17R_H+0.83R_W$.

In this case, the radius $R_{A3}$ of the outer periphery of the third region A3 is preferably $R_W$ or more. The radius $R_{A3}$ of the outer periphery of the third region A3 is preferably $1.5R_W$ or less, and more preferably $1.3R_W$ or less. The radius $R_{A3}$ of the outer periphery of the third region A3 is most preferably $1.2R_W$.

The first driver D1, the second driver D2, the third driver D3, and the fourth driver D4 control light emission of corresponding light emitting elements 44L in the irradiating part 44, for example, based on a command from the controller 45. That is, the controller 45 commands the first driver D1, the second driver D2, the third driver D3, and the fourth driver D4 to control light emission of the light emitting elements 44L. The first driver D1, the second driver D2, the third driver D3, and the fourth driver D4 may be referred to as "drivers" when describing them without distinction.

The controller 45 may perform control of selecting the light-emitting element 44L to be caused to emit light among the plurality of light-emitting elements 44L in each of the first region A1, the second region A2, and the third region A3. Thus, it is possible to adjust the amount of light emission per unit area in each of the first region A1, the second region A2, and the third region A3.

The controller 45 may control the amount of light to be emitted by the light-emitting elements 44L in each of the first region A1, the second region A2, and the third region A3. Thus, it is possible to adjust the amount of light emission per unit area in each of the first region A1, the second region A2, and the third region A3.

The light emission of the light-emitting element 44L is controlled by a current supplied from the driver. In this example, the driver is provided in the irradiating part 44. The configuration is not limited to this, and the driver may be provided to an external entity of the irradiating part 44, such as the controller 45.

In this example, the surface of the irradiating part 44 on which the light-emitting elements 44L are mounted includes four divided portions resulting from two straight lines being orthogonal to each other on the surface while passing on the position corresponding to the center of the workpiece W. When a group of a plurality of light emitting elements 44L included in each division portion is defined as one control group, each of the first driver D1, the second driver D2, the third driver D3, and the fourth driver D4 collectively controls light emission of the light-emitting elements 44L belonging to its corresponding group. The number of control groups of the light-emitting elements 44L may be 3 or less, or 5 or more. In addition, regarding how to divide, the respective division groups do not need to have the same shape.

Division into control groups corresponding to the respective drivers may be based on circles centered on the position corresponding to the center of the workpiece W. Such a dividing method includes a dividing method corresponding to the above-described first region A1, second region A2, and third region A3. This dividing method may be combined with the dividing method illustrated in FIG. 5. In this case, since each division portion of FIG. 5 is further divided so as to correspond to the first region A1, second region A2, and third region A3, the number of control groups of the light emitting element 44L becomes 12 (the number of drivers is also 12).

Modified Example of the Configuration of the Irradiating Part

Figure 6:
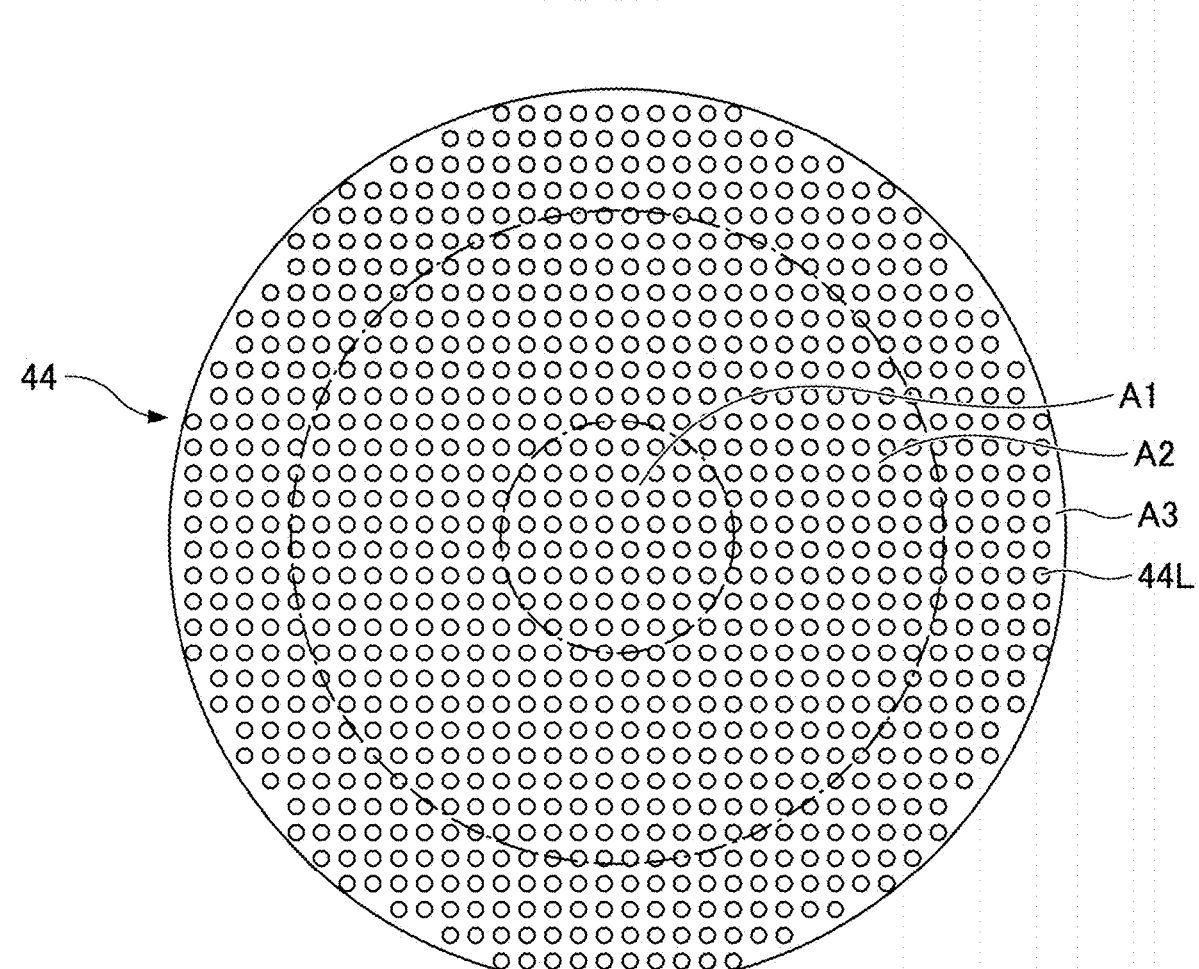
FIG. 6 is an exemplary diagram illustrating another example of a configuration of an irradiating part of a heating device according to the first embodiment of the present invention as viewed from the workpiece side in a direction perpendicular to a main surface of the workpiece.

FIG. 6 is an exemplary view illustrating another example of the configuration of the irradiating part 44 of the heating device 4 according to the first embodiment of the present invention as viewed from the workpiece W side in the direction perpendicular to the main surface of the workpiece W. In the following description, description of the configuration similar to that illustrated in FIG. 5 may be omitted. Although the driver is not illustrated in FIG. 6, an example of the configuration of the driver applicable to this modified example will be described below with reference to FIGS. 7 and 8.

In the configuration according to this example, the light emitting elements 44L are arranged at equal intervals over the entirety of the first region A1, the second region A2, and the third region A3. As long as the same effect as that of this modified example can be obtained, the light emitting elements 44L do not need to be arranged at equal intervals.

Hereinafter, an example of the configuration for controlling the light emitting elements 44L in this modified example will be described, but the present invention is not limited to this example.

Figure 7:
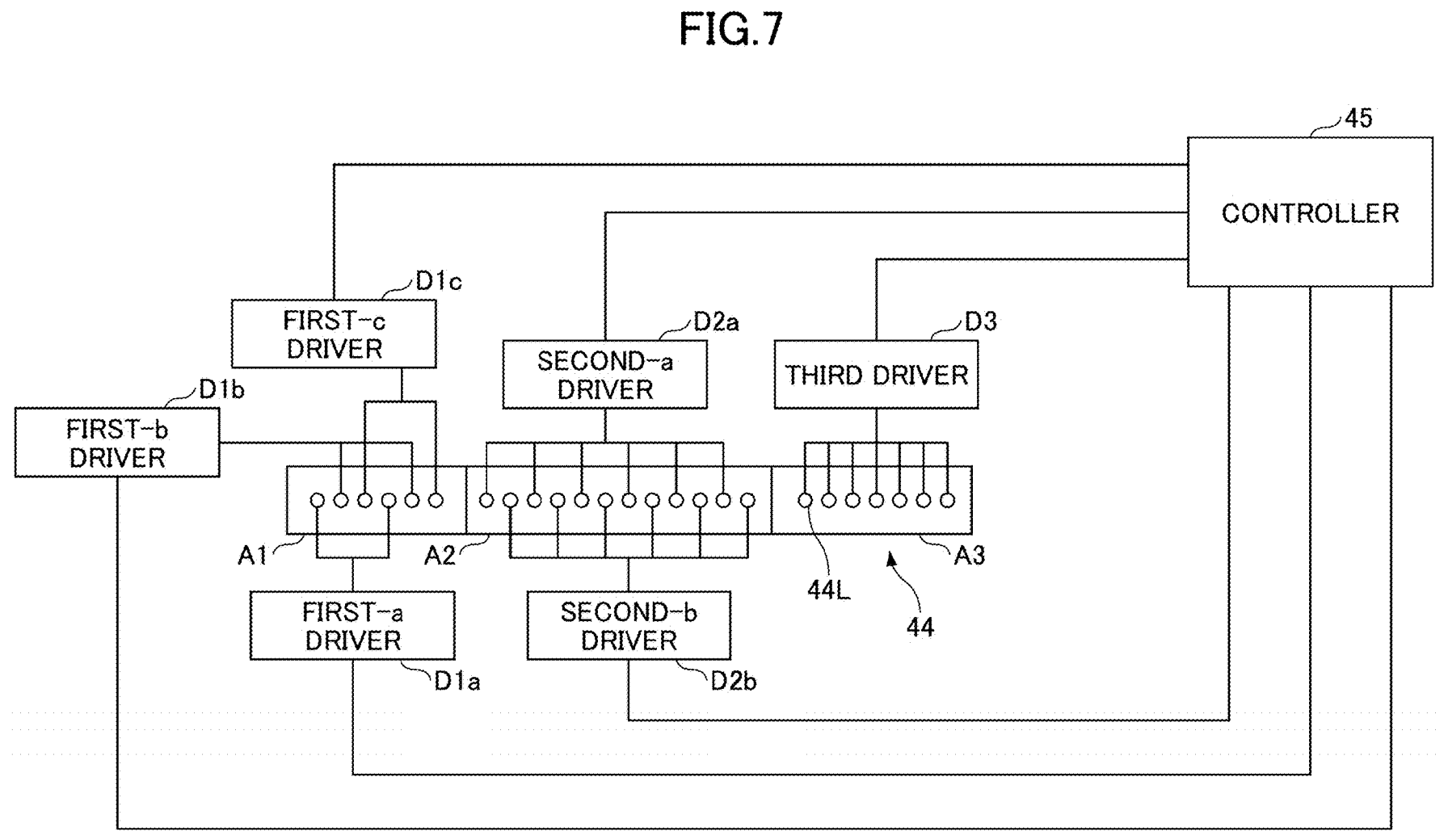

FIG. 7 is a conceptual diagram illustrating an example of the configuration for controlling the irradiating part 44 illustrated in FIG. 6. That is, in this diagram, the number and arrangement of the light emitting elements 44L only conceptually illustrate the idea of the control groups, and do not correspond to the actual number and arrangement of the light emitting elements 44L. In this example, the light emitting elements 44L in the first region A1 include three control groups, the light emitting elements 44L in the second region A2 include two control groups, and the light emitting elements in the third region A3 include one control group.

In this example, in the first region A1, a first-a driver D1a, a first-b driver D1b, and a first-c driver D1c control light emission of different light emitting elements 44L. In the second region A2, a second-a driver D2a and a second-b driver D2b control light emission of different light emitting elements 44L. In the third region, a third driver D3 controls light emission of the light emitting elements 44L.

For example, the control of the amount of light emission of the light emitting elements 44L by the drivers D1a, D1b, D1c, D2a, D2b, and D3 is performed based on a command from the controller 45. That is, in this example, the controller 45 gives a command to control the light emission of the light emitting elements 44L corresponding to the respective drivers.

According to the configuration of this example, the light emitting elements 44L can be selectively caused to emit light. Therefore, the number of light emitting elements 44L that are caused to emit light per unit area can be adjusted in each region. Moreover, by selectively using each control group in each region, the frequency of use of each light emitting element 44L is reduced. Thus, cost reduction by less frequent maintenance is possible.

The number of control groups in each region is not limited to the number described here. Further, the light emitting elements 44L provided in the third region A3 may be divided into two or more control groups.

One preferred example is to periodically arrange the nearest adjacent light emitting elements 44L in each of the first region A1 and the second region A2 so as to belong to different control groups. However, the present invention is not limited to this. As another example, the light emitting elements 44L controlled by the second-a driver D2a and the light emitting elements 44L controlled by the second-b driver D2b may be arranged in a pattern.

In this control method, the number of light emitting elements 44L that are caused to emit light per unit area in the third region A3 is larger than the number of light emitting elements 44L that are caused to emit light per unit area in the first region A1 and the number of light emitting elements 44L that are caused to emit light per unit area in the second region A2.

In this control method, more preferably, the number of light emitting elements 44L that are caused to emit light per unit area in the second region A2 is larger than the number of light emitting elements 44L that are caused to emit light per unit area in the first region A1.

The number of light emitting elements 44L that are caused to emit light per unit area in the first region A1 is defined as $N_1$, the number of light emitting elements 44L that are caused to emit light per unit area in the second region A2 is defined as $N_2$, and the number of light emitting elements 44L that are caused to emit light per unit area in the third region A3 is defined as $N_3$.

$N_1/N_2$ is preferably 0.70 or less, more preferably 0.50 or less, and yet more preferably 0.30 or less. This is for suppressing an excessive temperature rise in a portion of the workpiece W close to the hole H since this portion would be readily heated, and for inhibiting a component or the like in the chamber 40 from being heated by light passing through the hole H. $N_1/N_2$ may be 0. That is, light emission of light emitting elements 44L does not need to be performed in the first region A1, and the first region A1 does not need to be provided with light emitting element 44L and a driver.

$N_2/N_3$ is preferably 0.80 or less, more preferably 0.60 or less, and yet more preferably 0.40 or less. This is for more efficiently heating the workpiece around the outer periphery thereof by adjusting the amount of light emission from the third region A3 to be higher than the amount of light emission from the second region A2, since heat easily escapes the peripheral end of the workpiece W. $N_2/N_3$ is preferably 0.050 or more, more preferably 0.10 or more, and yet more preferably 0.20 or more. This is to suppress the outer region of the workpiece W from being excessively heated.

Assuming that the number of light emitting elements 44L to be caused to emit light per unit area in the m-th region Am other than the first region A1 (where m is 2, 3, or other) is $N_m$, it is preferable to cause at least one light emitting element 44L to emit light in a circle contained within the m-th region Am and having an area of $25/N_m$, it is more preferable to cause at least one light emitting element 44L to emit light in a circle contained within the m-th region Am and having an area of $12/N_m$, and it is yet more preferable to cause at least one light emitting element 44L to emit light in a circle contained within the m-th region Am and having an area of $8.0/N_m$. This is to suppress unevenness in the amount of light irradiation on the workpiece W.

Figure 8:
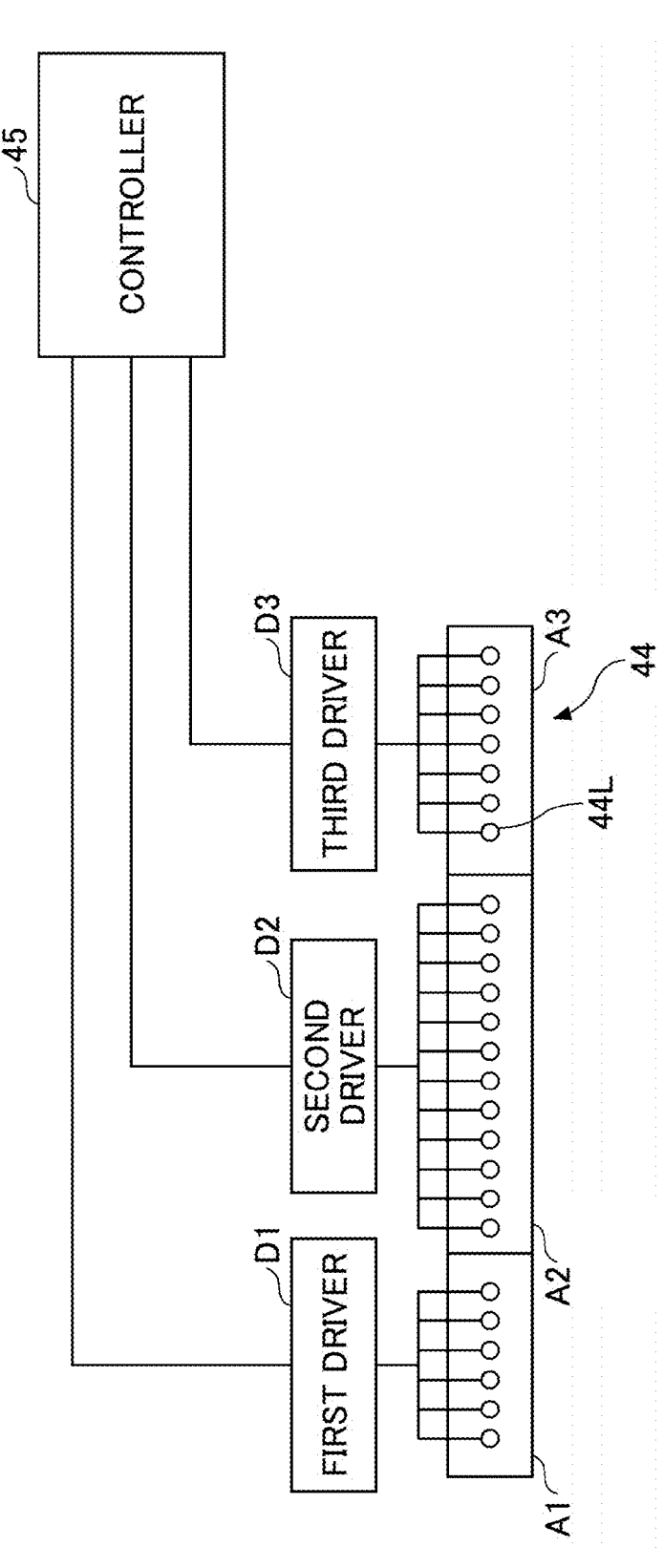
FIG. 8 is a conceptual diagram illustrating another example of a configuration for controlling the irradiating part illustrated in FIG. 6.

FIG. 8 is a conceptual diagram illustrating another example of a configuration for controlling the irradiating part 44 illustrated in FIG. 6. That is, in this diagram, the number and arrangement of the light emitting elements 44L only conceptually illustrate the idea of a control group, and do not correspond to the actual number and arrangement of the light emitting elements 44L.

As another example of the control method in the configuration illustrated in FIG. 8, the amount of light emission per unit area in each region is adjusted by controlling the amount of light emitted by the light emitting elements 44L. Here, for example, the amount of light emitted by the light emitting elements 44L is controlled based on the magnitude of the current supplied to the light emitting elements 44L. Further, for example, a pulse wave current may be supplied to the light emitting elements 44L. In this case, it is preferable to control the amount of light emitted by the light emitting elements 44L based on, for example, a duty ratio (PWM control). The method of controlling the amount of light emitted by the light emitting elements 44L is not limited to these methods, and the amount of light emission may be controlled based on voltage, frequency, or the like.

In this example, the first driver D1 controls the amount of light emitted by the light emitting elements 44L provided in the first region A1, the second driver D2 controls the amount of light emitted by the light emitting elements 44L provided in the second region A2, and the third driver D3 controls the amount of light emitted by the light emitting elements 44L provided in the third region A3. The drivers D1, D2, and D3 control the amount of light emitted by the light emitting elements 44L based on, for example, a command from the controller 45. That is, in this example, the controller 45 gives a command for adjusting the amount of light emitted by the light emitting elements 44L in each of the first region A1, the second region A2, and the third region A3.

In this example, the amount of light emitted per light emitting element 44L ascends in the order of the first region A1, the second region A2, and the third region A3. In this example, the amount of light emitted per light emitting element 44L in each region is an average value obtained by dividing the total amount of light emission in each region by the number of light emitting elements 44L provided in the region. In this example, all of the light emitting elements 44L in each region may emit light in the same amount, or at least some of the light emitting elements 44L may emit a differing amount of light.

The amount of light emitted per light emitting element 44L in the first region A1 is defined as $I_{L1}$, the amount of light emitted per light emitting element 44L in the second region A2 is defined as $I_{L2}$, and the amount of light emitted per light emitting element 44L in the third region A3 is defined as $I_{L3}$.

$I_{L1}/I_{L2}$ is preferably 0.70 or less, more preferably 0.50 or less, and yet more preferably 0.30 or less. This is for suppressing an excessive temperature rise in a portion of the workpiece W close to the hole H since this portion would be readily heated, and for inhibiting a component or the like in the in the chamber 40 described below from being heated by light passing through the hole H. $I_{L1}/I_{L2}$ may be 0. That is, the light emitting elements 44L in the first region A1 do not need to perform light emission.

$I_{L2}/I_{L3}$ is preferably 0.80 or less, more preferably 0.60 or less, and yet more preferably 0.40 or less. This is because it is necessary to adjust the amount of light emission in the third region A3 to be higher than that in the second region A2 since heat easily escapes the peripheral end of the workpiece W. $I_{L2}/I_{L3}$ is preferably 0.050 or more, more preferably 0.10 or more, and yet more preferably 0.20 or more. This is to suppress temperature difference between the inner region and the outer region of the workpiece W.

The heating device 4 according to the present embodiment is a heating device for heating a workpiece W having a disk shape with a hole H in the center and having a pair of main surfaces opposite to each other by irradiating the workpiece W with light, and includes an irradiating part 44 facing at least one of the pair of main surfaces and configured to irradiate the workpiece W with light, wherein the irradiating part 44 includes a plurality of light emitting elements 44L on a surface facing a main surface of the workpiece W, and the surface of the irradiating part 44 facing the workpiece W includes a first region A1 including a position corresponding to the center of the workpiece W, a second region A2 surrounding the first region A1 from the outer side, and a third region A3 surrounding the second region A2 from the outer side and including a position corresponding to the outer periphery of the workpiece W, wherein the amount of light emission per unit area in the third region A3 is higher than the amount of light emission per unit area in the first region A1 and the amount of light emission per unit area in the second region A2.

When heating the workpiece W, heat easily escapes the outer peripheral end of the workpiece W, and the temperature around the outer periphery of the workpiece W does not so easily rise as the temperature on the inner region of the workpiece. On the other hand, according to the configuration of this embodiment, since the amount of light emission per unit area of the third region A3 corresponding to the outer region of the workpiece W is higher than that of the first region A1 and the second region A2, the difference between the temperature at the outer periphery of the workpiece W where heat easily escapes and the temperature on the inner region of the workpiece W can be reduced. Furthermore, since this configuration can avoid heating the inner region of the workpiece W more than necessary, it is possible to reduce the electric power to be used and the occurrence of defective products due to excessive heating, which also leads to improvement of the productivity of the process.

In view of the foregoing, according to the present embodiment, it is possible to provide a heating device 4 capable of heating a surface of a workpiece W having a disk shape with a hole in the center at a high productivity and a high uniformity.

Furthermore, according to the present embodiment, it is possible to configure the amount of light emission per unit area in the second region A2 to be higher than the amount of light emission per unit area of the first region A1. By reducing the amount of light emission in the first region A1 including the position corresponding to the center of the workpiece W, it is possible to suppress the heating device 4 itself from being heated by light passing through the hole H in the workpiece W in which the hole H is formed, leading to protection of the heating device 4.

The method for manufacturing the magnetic recording medium 1 according to the present embodiment further includes a magnetic layer forming step S103 for forming a magnetic layer 14 on a workpiece W having a disk shape with a hole H in the center and having a pair of main surfaces opposite to each other, a heating step S104 for heating the workpiece W by irradiating the workpiece W with light after the magnetic layer forming step S103, wherein the heating step S104 is performed by irradiating at least one main surface of the workpiece W with light by an irradiating part 44 including a plurality of light emitting elements 44L on a surface facing the at least one of the pair of main surfaces of the workpiece W, wherein the surface of the irradiating part 44 facing the workpiece W includes a first region A1 including a position corresponding to the center of the workpiece W, and a second region A2 surrounding the first region from the outer side, and a third region A3 surrounding the second region from the outer side and including a position corresponding to the outer periphery of the workpiece W, wherein the amount of light emission per unit area in the third region A3 is higher than the amount of light emission per unit area in the first region A1 and the amount of light emission per unit area in the second region A2.

According to the present embodiment, it is possible to provide a method of manufacturing a magnetic recording medium 1 capable of heating a surface of a workpiece W having a disk shape with a hole H in the center at a high productivity and a high uniformity. In other words, according to the present embodiment, it is possible to provide a method of manufacturing a magnetic recording medium 1 that can manufacture a magnetic recording medium 1 having a disk shape with a hole H in the center at a high productivity and a high quality.

Second Embodiment

Figure 9:
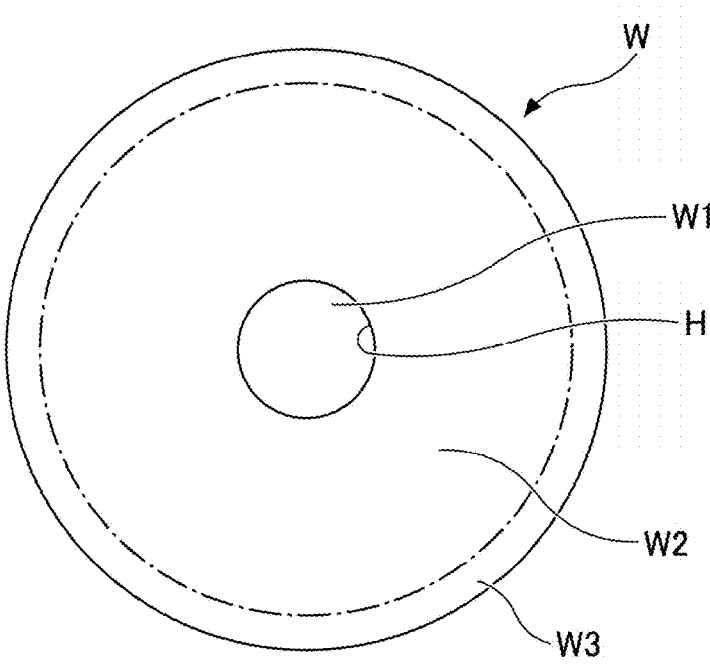
FIG. 9 is a diagram illustrating an example of a distribution of a light irradiation amount on a main surface of a workpiece by an irradiating part of a heating device according to a second embodiment of the present invention.

FIG. 9 is a diagram illustrating an example of the distribution of the amount of light irradiation on the main surface of the workpiece W by the irradiating part 44 of the heating device 4 according to the second embodiment of the present invention. In this embodiment, description of any configuration that may be the same as that of the above-described embodiment may be omitted. For example, in this embodiment, the configurations of the magnetic recording medium 1, the method of manufacturing the magnetic recording medium 1, the apparatus 3 for manufacturing the magnetic recording medium 1, and the heating device 4 may be the same as those of the first embodiment. Further, the configuration of the irradiating part 44 according to the first embodiment can be partially applied as the configuration of the irradiating part 44 of the present embodiment. For example, the configuration of the irradiating part 44 illustrated in FIG. 6 can be applied.

When a plane including the main surface of the workpiece W is defined as the irradiation-target surface, the heating device 4 of this embodiment controls the amount of light irradiation on the irradiation-target surface as described below.

The irradiation-target surface includes a first region W1 in which the hole H of the workpiece W is formed, a second region W2 surrounding the first region W1 from the outer side, and a third region W3 surrounding the second region W2 from the outer side and extending from the outer periphery of the second region W2 to the outer periphery of the workpiece W. Here, the radius of the hole H is defined as $R_H$, the radius of the outer periphery of the workpiece W is defined as $R_W$, the radius of the outer periphery (the boundary between the second region and the third region) of the second region W2 is defined as $0.30R_H+0.70R_W$, and the radius of the outer periphery of the third region W3 is defined $R_W$.

Here, the average amount of light irradiation on the first region W1 is defined as $I_1$, the average amount of light irradiation on the second region W2 is defined as $I_2$, and the average amount of light irradiation on the third region W3 is defined as $I_3$. The average amount of light irradiation on each region is a value obtained by dividing the total amount of light irradiation from the light emitting elements on each region of the irradiation-target surface by the area of the region.

$I_1/I_2$ is 1.00 or less, preferably 0.96 or less, and yet more preferably 0.94 or less. This is for suppressing an excessive temperature rise in a portion of the workpiece W close to the hole H since this portion would be readily heated, and for inhibiting a component or the like in the chamber 40 from being heated by light passing through the hole H. $I_1/I_2$ is preferably 0.85 or more, and more preferably 0.90 or more. This is for sufficiently heating the vicinity of the hole H of the workpiece W.

$I_3/I_2$ is 1.50 or less, preferably 1.20 or less, and more preferably 1.00 or less. This is to suppress the amount of irradiation light that may escape from the outer region of the workpiece W and to more reliably protect the heating device 4. $I_3/I_2$ is 0.90 or more, preferably 0.93 or more, and yet more preferably 0.96 or more. This is for more efficiently heating the workpiece W around the outer periphery thereof by adjusting the amount of light irradiation on the third region W3 to be higher than that on the second region W2, since heat easily escapes the outer peripheral end of the workpiece W.

The minimum value of the light irradiation intensity on each of the second region W2 and the third region W3 (in each region) is preferably 0.80 times or more, more preferably 0.85 times or more, and yet more preferably 0.90 times or more the average amount of light irradiation on the region. This is to suppress local underheating of the workpiece W.

The maximum value of the light irradiation intensity on each of the second region W2 and the third region W3 is preferably 1.50 times or less, more preferably 1.30 times or less, and yet more preferably 1.10 times or less the average amount of light irradiation on the region. This is to suppress local overheating of the workpiece W.

Although FIG. 9 illustrates the configuration of the regions on one main surface of the workpiece W, both main surfaces of the workpiece W may be irradiated with light. In this case, the configurations and shapes of the regions on both main surfaces may be identical (identical in a projection in the direction perpendicular to the main surfaces) or different.

Figure 10:
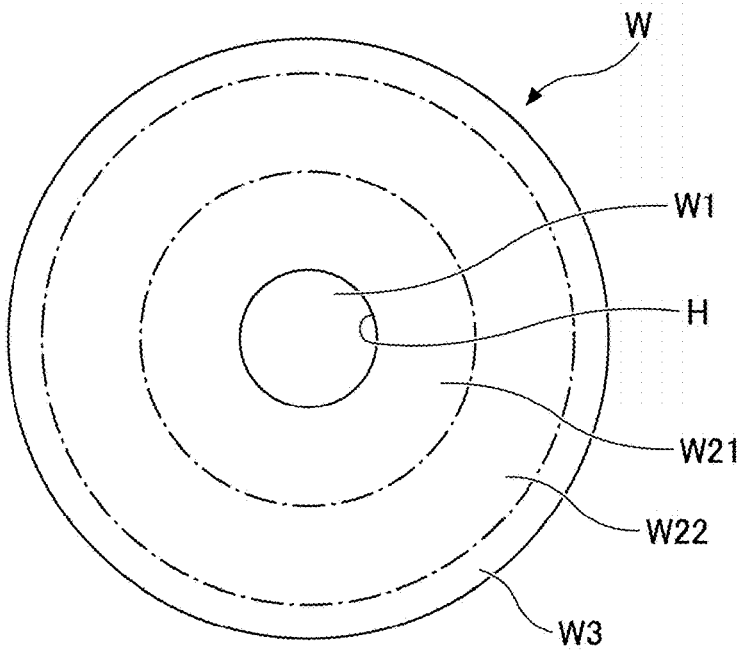
FIG. 10 is a diagram illustrating a modified example of a distribution of a light irradiation amount on a main surface of the workpiece by the irradiating part of the heating device according to the second embodiment of the present invention.

FIG. 10 is a diagram illustrating a modified example of the distribution of the amount of light irradiation on the main surface of the workpiece W by the irradiating part 44 of the heating device 4 according to the second embodiment of the present invention. In this example, the second region W2 includes two regions, namely a 21st region W21 adjacent to the first region W1, and a 22nd region W22 located on the outer side of the 21st region W21.

Here, the outer periphery of the 21st region W21 is on the middle position between the inner periphery of the second region W2 (the outer periphery of the first region W1) and the outer periphery of the second region W2 (the inner periphery of the third region W3). That is, when the radius of the outer periphery of the first region W1 is defined as $R_{W1}$ and the radius of the outer periphery of the second region W2 is defined as $R_{W2}$, the radius $R_{W21}$ of the outer periphery of the 21st region W21 is defined as $0.50R_{W1}+0.50R_{W2}$. In other words, in the second region W2, a circle having a radius of $0.50R_{W1}+0.50R_{W2}$ from the center of the workpiece W and the inner side of the circle are defined as the 21st region W21, and the outer side of the circle is defined as the 22nd region.

In this case, assuming that the average amount of light irradiation on the 21st region W21 is $I_{21}$ and the average amount of light irradiation on the 22nd region W22 is $I_{22}$, $I_{21}/I_{22}$ is preferably 0.70 or more and 1.50 or less, more preferably 0.85 or more and 1.20 or less, and yet more preferably 0.95 or more and 1.05 or less. This is for suppressing unevenness in the heating degree between the inner side and the outer side of the workpiece W.

The specifications regarding the average amount of light irradiation in the modified example illustrated in FIG. 10 and the specifications regarding the average amount of light irradiation in the above-described embodiment illustrated in FIG. 9 may be combined. In this case, the radius $R_{W2}$ of the outer periphery of the second region W2 is $0.30R_H+0.70R_W$. Further, in the examples illustrated in FIGS. 9 and 10, $R_H$ is equal to $R_{W1}$, but the hole H may be formed inside the first region W1 (a state in which $R_H<R_{W1}$). The first region W1 may be positioned inside the hole H (a state in which $R_H>R_{W1}$).

The heating device 4 according to this embodiment is a heating device for heating a workpiece W having a disk shape with a hole H in the center and having a pair of main surfaces opposite to each other, by irradiating the workpiece W with light, wherein the heating device 4 includes an irradiating part 44 that faces at least one of the pair of main surfaces of the workpiece W and irradiates the workpiece W with light, wherein the irradiating part 44 includes a plurality of light emitting elements 44L on a surface facing the main surface of the workpiece W, and wherein in a case where a plane including a main surface of the workpiece W is defined as an irradiation-target surface, the irradiation-target surface includes a first region W1 in which the hole H of the workpiece W is formed, a second region W2 surrounding the first region W1 from the outer side, and a third region W3 extending from the outer periphery of the second region W2 to the outer periphery of the workpiece W, and wherein in a case where the radius of the hole H is defined as Rx, the radius of the outer periphery of the workpiece W is defined as $R_W$, the radius of the outer periphery of the second region W2 is defined as $0.30R_H+0.70R_W$, and the radius of the outer periphery of the third region W3 is defined as $R_W$, and the average amount of light irradiation on the first region W1 is defined as $I_1$, the average amount of light irradiation on the second region W2 is defined as $I_2$, and the average amount of light irradiation on the third region W3 is defined as $I_3$, $I_1/I_2$ is 1.00 or less, and $I_3/I_2$ is 0.90 or more and 1.50 or less.

When heating the workpiece W, heat easily escapes the outer peripheral end of the workpiece W, and the temperature around the outer periphery of the workpiece W does not so easily rise as the temperature on the inner region of the workpiece. On the other hand, according to the heating device 4 of the present embodiment, the average amount of light irradiation on the third region W3 corresponding to the outer region of the workpiece W is adjusted to be a certain amount or more with respect to the second region W2, that is, $I_3/I_2$ is adjusted to be 0.90 or more. With this configuration, the difference between the temperature at the outer periphery of the workpiece W, where heat easily escapes, and the temperature at the inner region of the workpiece W can be reduced. Furthermore, since this configuration can avoid heating the inner region of the workpiece W more than necessary, it is possible to reduce the electric power to be used, and the occurrence of defective products due to excessive heating, leading to improvement of the productivity of the process. By adjusting $I_3/I_2$ to be 1.50 or less, it is possible to suppress an excessive temperature rise around the outer peripheral end of the workpiece W.

In addition, by adjusting $I_1/I_2$ to be 1.00 or less, that is, by making the amount of light irradiation on the first region W1 including the center of the workpiece W smaller than that on the second region W2, it is possible to inhibit the heating device 4 itself from being heated by light passing through the hole H of the workpiece W in which the hole H is formed, and to protect the heating device 4.

A method for manufacturing a magnetic recording medium 1 according to the present embodiment includes a magnetic layer forming step S103 for forming a magnetic layer 14 on a workpiece W having a disk shape with a hole H in the center and having a pair of main surfaces opposite to each other, wherein the method includes a heating step S104 for heating the workpiece W by irradiating the workpiece W with light after the magnetic layer forming step S103, wherein the heating step S104 is performed by irradiating at least one of the pair of main surfaces of the workpiece W with light by an irradiating part including a plurality of light emitting elements on a surface facing the main surface of the workpiece W, wherein in a case where a plane including at least one main surface of the workpiece W is defined as an irradiation-target surface, the irradiation-target surface includes a first region W1 in which the hole H of the workpiece W is formed, a second region W2 surrounding the first region W1 from the outer side, and a third region W3 extending from the outer periphery of the second region W2 to the outer peripheral end of the workpiece W, and in a case where the radius of the hole H is defined as $R_H$, the radius of the outer periphery of the workpiece W is defined as $R_W$, the radius of the outer periphery of the second region W2 is defined as $0.30R_H + 0.70R_W$, and the radius of the outer periphery of the third region W3 is defined as $R_W$, and the average amount of light irradiation on the first region W1 is defined as $I_1$, the average amount of light irradiation on the second region W2 is defined as $I_2$, and the average amount of light irradiation on the third region W3 is defined as $I_3$, $I_1/I_2$ is 1.00 or less, and $I_3/I_2$ is 0.90 or more and 1.50 or less.

According to the method of manufacturing the magnetic recording medium 1 according to the present embodiment, it is possible to reduce the difference between the temperature on the outer periphery of the workpiece W from which heat easily escapes and the temperature of the inner region of the workpiece W. Furthermore, since this configuration can avoid heating the inner region of the workpiece W more than necessary, it is possible to reduce the electric power to be used and the occurrence of defective products due to excessive heating, which leads to improvement of the productivity of the process. Furthermore, it is possible to inhibit the heating device 4 itself from being heated by light passing through the hole H, and to protect the heating device 4.

Although the embodiments have been described above, the above embodiments are presented as examples, and the present invention is not limited by the above embodiments. The above embodiments can be carried out in various other forms, and various combinations, omissions, substitutions, modifications, and the like are applicable without departing from the spirit of the invention. These embodiments and modifications thereof are included in the scope and spirit of the invention, as well as in the scope of the invention described in the claims and equivalents thereof.

What is claimed is:

1. A heating device for heating a workpiece having a disk shape with a hole in a center and having a pair of main surfaces opposite to each other by irradiating the workpiece with light, the heating device comprising:

an irradiating part facing at least one main surface of a pair of main surfaces of a workpiece and configured to irradiate the workpiece with light, wherein the irradiating part includes a plurality of light emitting elements on a surface thereof facing the at least one main surface of the workpiece, the surface of the irradiating part facing the workpiece includes a first region including a position corresponding to a center of the workpiece, a second region surrounding the first region from an outer side, and a third region surrounding the second region from an outer side and including a position corresponding to an outer periphery of the workpiece, and an amount of light emission per unit area in the third region is greater than an amount of light emission per unit area in the first region and an amount of light emission per unit area in the second region, wherein an outer periphery of the first region, an outer periphery of the second region, an outer periphery of the third region, the outer periphery of the workpiece, and a shape of a hole of the workpiece are concentric circles when viewed in a direction perpendicular to the main surfaces of the workpiece, in a case where a radius of the workpiece is defined as $R_W$ and a radius of the hole is defined as $R_H$, a radius of the outer periphery of the first region is $0.50R_H$ or more and $0.43R_H + 0.57R_W$ or less, and a radius of the outer periphery of the second region is $0.40R_H + 0.60R_W$ or more and $0.03R_H + 0.97R_W$ or less, and $L_1/L_2$ is 0.70 or less, and $L_2/L_3$ is 0.050 or more and 0.80 or less, where $L_1$ is the amount of light emission per unit area in the first region, $L_2$ is the amount of light emission per unit area in the second region, and $L_3$ is the amount of light emission per unit area in the third region.

2. The heating device according to claim 1, further comprising a pair of irradiating parts facing the pair of main surfaces of the workpiece, respectively, wherein each of the pair of irradiating parts is the irradiating part.

3. The heating device according to claim 1, wherein a radius of the outer periphery of the third region is $R_W$ or more and $1.5R_W$ or less.

4. The heating device according to claim 1, wherein number of the light emitting elements provided per unit area in the third region is greater than number of the light emitting elements provided per unit area in the first region and number of the light emitting elements provided per unit area in the second region.

5. The heating device according to claim 1, further comprising:

a controller configured to control light emission of the light emitting elements, wherein the controller performs control of selecting the light emitting elements that are to be caused to emit light among the plurality of light emitting elements in each of the first to third regions.

6. The heating device according to claim 1, further comprising:

a controller configured to control light emission of the light emitting elements, wherein the controller controls the amount of light emission of the light emitting elements in each of the first to third regions.

7. The heating device according to claim 6, wherein the controller issues a command for adjusting the amount of light emission of the light emitting elements in each of the first to third regions, and the heating device further comprises:

a first driver configured to control the amount of light emission of the light emitting elements provided in the first region based on the command from the controller;

a second driver configured to control the amount of light emission of the light emitting elements provided in the second region based on the command from the controller; and a third driver configured to control the amount of light emission of the light emitting elements provided in the third region based on the command from the controller.

8. The heating device according to claim 1, wherein number of the light emitting elements provided per unit area in the second region is greater than number of the light emitting elements provided per unit area in the first region.

9. The heating device according to claim 8, wherein $N_1/N_2$ is 0.70 or less, and $N_2/N_3$ is 0.050 or more and 0.80 or less, where $N_1$ is the number of the light emitting elements provided per unit area in the first region, $N_2$ is the number of the light emitting elements provided per unit area in the second region, and $N_3$ is number of the light emitting elements provided per unit area in the third region.

10. The heating device according to claim 1, further comprising:

a controller configured to control light emission of the light emitting elements, wherein the controller performs control of selecting the light emitting elements that are to be caused to emit light among the plurality of light emitting elements in each of the first to third regions.

11. The heating device according to claim 1, further comprising:

a controller configured to control light emission of the light emitting elements, wherein the controller controls the amount of light emission of the light emitting elements in each of the first to third regions.

12. The heating device according to claim 1, wherein:

the number of the light emitting elements provided per unit area in the third region is greater than the number of the light emitting elements provided per unit area in the first region and the number of the light emitting elements provided per unit area in the second region;

the heating device further comprises first, second, and third drivers configured to operate independently of each other and corresponding to the first region, the second region, and the third region, respectively; and the first driver is configured to adjust $L_1/L_2$ to 0.70 or less by selectively controlling light emission of individual light emitting elements among the plurality of the light emitting elements arranged in the first region.

13. The heating device according to claim 12, wherein the first driver is configured to adjust $L_1/L_2$ to 0.70 or less by selectively controlling light emission of individual light emitting elements among the plurality of light emitting elements arranged in the first region, without changing a light emission amount per light emitting element.

* * * * *